United States Patent [19]

Frew et al.

[11] Patent Number: 5,327,327
[45] Date of Patent: Jul. 5, 1994

[54] THREE DIMENSIONAL ASSEMBLY OF INTEGRATED CIRCUIT CHIPS

[75] Inventors: Dean L. Frew, Garland; Mark A. Kressley, Richardson; Arthur M. Wilson, Richardson; Juanita G. Miller, Richardson; Philip E. Hecker, Jr., Garland, all of Tex.; James Drumm, Crystal Lake, Ill.; Randall E. Johnson; Rick Elder, both of Houston, Tex.

[73] Assignee: Texas Instruments Incorporated, Dallas, Tex.

[21] Appl. No.: 969,602

[22] Filed: Oct. 30, 1992

[51] Int. Cl.$^5$ ............................................. H05K 1/11
[52] U.S. Cl. ................................... 361/784; 361/760; 361/785; 361/792; 361/813; 174/52.1; 174/255; 439/68; 257/686; 257/697
[58] Field of Search ............... 361/392, 393, 397, 400, 361/401, 403, 412, 413, 414, 417, 419, 420, 728, 736, 760, 748, 761, 767, 784, 785, 792, 807, 809, 813; 257/678, 686, 697, 700, 723, 778; 439/68, 69, 70; 174/52.1, 255, 260

[56] References Cited

U.S. PATENT DOCUMENTS

| | | | |
|---|---|---|---|
| 4,525,921 | 7/1985 | Carson et al. | 29/577 |
| 4,617,160 | 10/1986 | Belanger et al. | 264/40.1 |
| 4,646,128 | 2/1987 | Carson et al. | 357/74 |
| 4,704,319 | 11/1987 | Belanger et al. | 428/209 |
| 4,706,166 | 11/1987 | Go et al. | 361/403 |
| 4,764,846 | 8/1988 | Go et al. | 361/388 |
| 4,983,533 | 1/1991 | Go et al. | 437/7 |
| 5,025,306 | 6/1991 | Johnson et al. | 357/75 |
| 5,104,820 | 4/1992 | Go et al. | 437/51 |

OTHER PUBLICATIONS

Texas Instrument Inc., Frew, High Density Memory Packaging, Jul. 1990, SPIE.
Dean L. Frew et al.-Tri-TMS320C30 Multichip Module: Signal Processor Package Design-Gomac '90 (Nov.).
Dean L. Frew-High Density Memory Packaging Technology High Speed Imaging Applications-SPIE Jul. 1990.
Robert Bruns et al.-Utilizing Three-Dimensional Memory Packaging and Silicon-On-Silicon Technology for Next Generation Recording Devices.

Primary Examiner—Leo P. Picard
Assistant Examiner—Young Whang
Attorney, Agent, or Firm—Gary C. Honeycutt; Richard L. Donaldson; William E. Hiller

[57] ABSTRACT

The multi-chip circuit module of the invention comprises a plurality of circuit chips assembled in a laminated stack. Each chip includes a plurality of layers of thin film interconnect patterns in the normal configuration, except for the final layer or layers, which comprise a reroute pattern that locates all circuit input and output pads along a single edge of each chip. The relocated pads are provided with contact bumps to facilitate the addition of a bonded lead to each I/O pad extending therefrom to a point beyond the edge of each chip. Thus, upon lamination the protruding tips form an array of leads on a single lateral face of the laminated chip stack.

4 Claims, 3 Drawing Sheets

THREE DIMENSIONAL ASSEMBLY OF INTEGRATED CIRCUIT CHIPS

FIELD OF THE INVENTION

This invention is closely related to U.S. Pat. No. 5,025,306 entitled, Assembly of Semiconductor Chips. The entire disclosure of U.S. 5,025,306 is incorporated herein by reference.

BACKGROUND OF THE INVENTION

The invention relates to the high density packaging of integrated circuit chips and more particularly to a method and apparatus for producing a multi-chip three dimensional circuit module comprising a laminated stack of chips to provide very high density 3D packaging of semiconductor memory devices, for example.

SUMMARY OF THE INVENTION

The multi-chip circuit module of the invention comprises a plurality of circuit chips assembled in a laminated stack. Each chip includes a plurality of layers of thin film interconnect patterns in the normal configuration, except for the final layer or layers, which comprise a reroute pattern that locates all circuit input and output pads along a single edge of each chip. The relocated pads are provided with contact bumps to facilitate the addition of a bonded lead to each I/O pad extending therefrom to a point beyond the edge of each chip. Thus, upon lamination the protruding tips form an array of leads on a single lateral face of the laminated chip stack.

In a preferred embodiment, the reroute pattern extends not only to the one edge of each chip, but in addition extends also to the opposite edge. Thus a duplicate set of I/O pads is provided with contact bumps to facilitate the addition of a bonded lead to each pad, extending therefrom to a point beyond the opposite edge. These extra leads are provided for test purposes, so that solder or other electrical connections to the other set may be readily tested. Instead of solder connections, conductive epoxy connections or mechanical contacts may be used.

The method of the invention comprises the steps of forming a final layer of thin film interconnects on each of a plurality of semiconductor circuit chips, to reroute all input/output terminal pads to locations along a single side of each chip. A conductive bump is provided at each reroute terminal pad location. An externally protruding lead tip is then attached to each of said bumps. Each of said lead tips extends beyond the edge of a single side of the chip. A plurality of said chips is then stacked vertically, or laminated, to form a stack of chips aligned such that each of said protruding lead tips extends outwardly from a single lateral face of the laminated stack.

The present invention differs from that of U.S. Pat. No. 5,025,306 in the following respects:

1. The rerouting layer that locates all input/output terminal pads along a single edge of each chip is formed directly on each chip, using conventional photolithography and thin-film pattering techniques, thereby eliminating the dielectric spacer required in accordance with the prior invention;
2. The tape automated bonding (TAB) step for attaching leads to the relocated I/O pads is a step not relevant in the prior invention. The TAB operation is advantageous in that it provides convenient testing of each chip, prior to lamination, thereby avoiding costly errors and reworks;
3. In the preferred embodiment, the rerouting pattern extends to both opposite edges of each chip in order to provide a second, auxiliary set of I/O contacts for testing, to be used after electrical connection of the module to a substrate, in order to detect any defective connections;
4. The step of potting the laminated stack of chips is no longer required. Because of precise alignment during the lamination step, the ends of the TAB leads lie in an exact plane, permitting the ends to be soldered to a substrate without the intermediate potting step or other processing. Also, the substrate is provided with larger pads for solder connections, to reduce contact errors.

Figure 1:
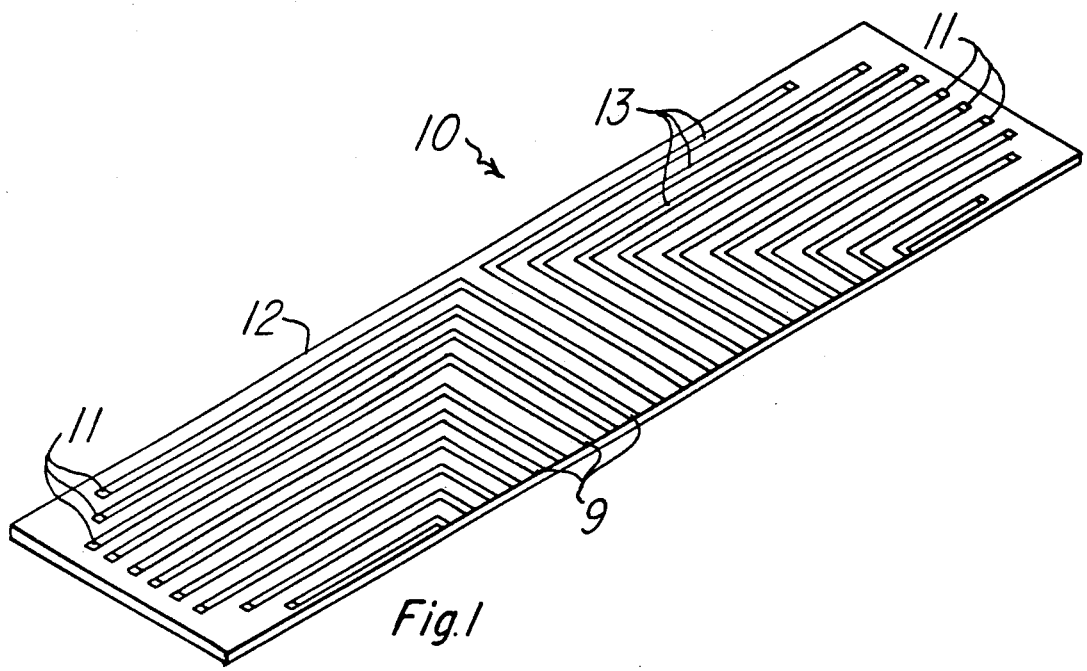
FIG. 1 is a top view of a semiconductor circuit chip showing the final layer of thin film interconnects which reroutes all input/output terminal pads to locations along a single edge of the chip.

As shown in FIG. 1 each chip 10 of the invention is initially completed with a plurality of terminal pads 11 located along the edges of the circuit chip. Subsequently, in accordance with the invention, a final insulating film 12 is applied over the entire surface of the chip and is patterned to expose only the input and output pads 11 as shown. Preferably, the insulating film consists of a polyimide resin film having a thickness of about 8 μm, and is applied using known techniques. For example, the film is formed by spin coating.

A preferred polyimide composition for use in forming film 12 is known as duPont PI 2611, which cures to provide a film having a thermal expansion coefficient of 6 ppm per degree centigrade, and excellent adhesion to aluminum. A cure temperature of 350° for 4 to 6 hours is preferred.

Figure 2:
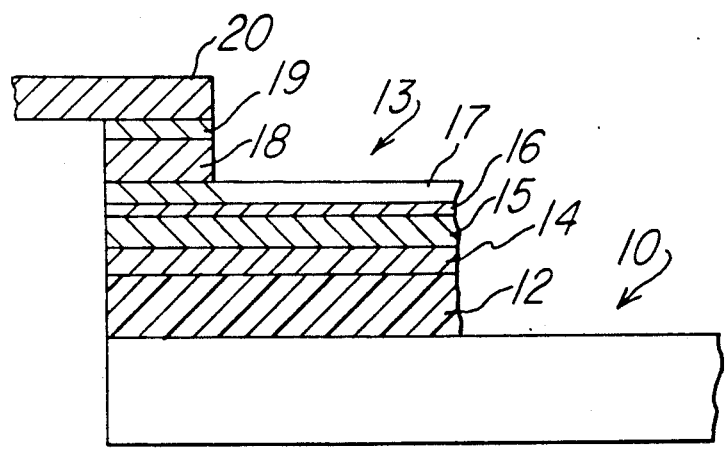
FIG. 2 is a fragmentary cross-section of the chip of FIG. 1, showing the attachment of tape automated bonded (TAB) leads to each of the relocated terminal pad bumps.

A final layer of metal 13 is then deposited and patterned in the configuration shown, to relocate all the input and output pads 9 along a single edge of the chip. As shown in FIG. 2, the final interconnect pattern 13 preferably consists of a multi-layer combination beginning with titanium-tungsten 14 followed by aluminum 15, and then a second layer of titanium-tungsten 16, and finally a gold film 17 which forms the base of a gold bump 18 completed at each of the relocated terminal pads along a single edge of the chip. A thin layer of tin 19 is then formed over the gold bump, in order to facilitate the attachment of bonded leads 20 which extend outwardly beyond the edge of the chip. Leads 20 are preferably gold-plated copper, bonded to the bumps by any of various known means, such as thermocompression bonding, for example. Other bump materials may be substituted for the gold.

Figure 3:
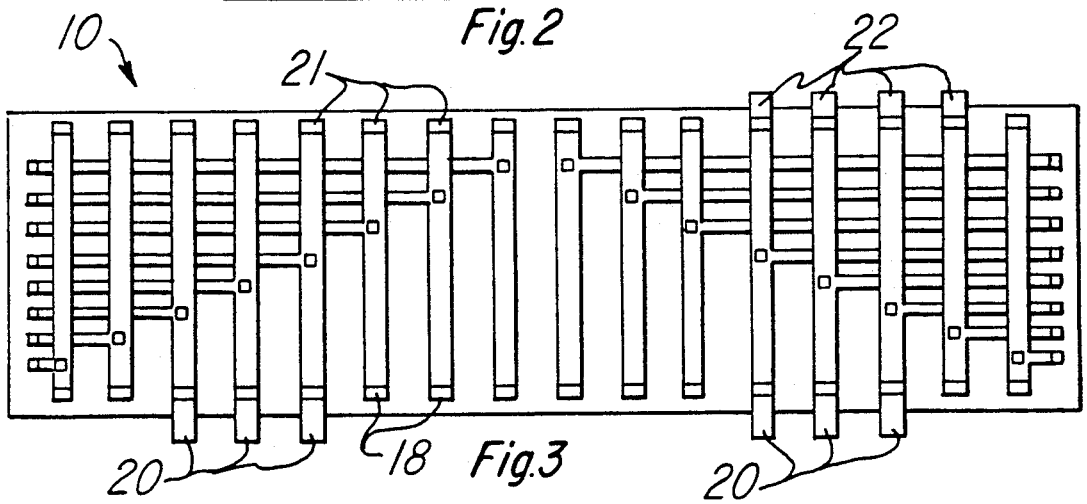
FIG. 3 is a top view of an alternate, preferred embodiment of the invention showing a second set of relocated terminal pad locations along the opposite edge of the chip, in addition to the locations illustrated in FIG. 1.

As shown in FIG. 3, each chip of the invention preferably includes a second, auxiliary set of I/O pads located along the opposite edge of each chip 10. Each of the second plurality of I/O pads also includes a gold bump 21 and a bonded lead 22 extending beyond the opposite edge of the chip, which permits testing immediately after the laminated stack is connected to a substrate.

Figure 4:
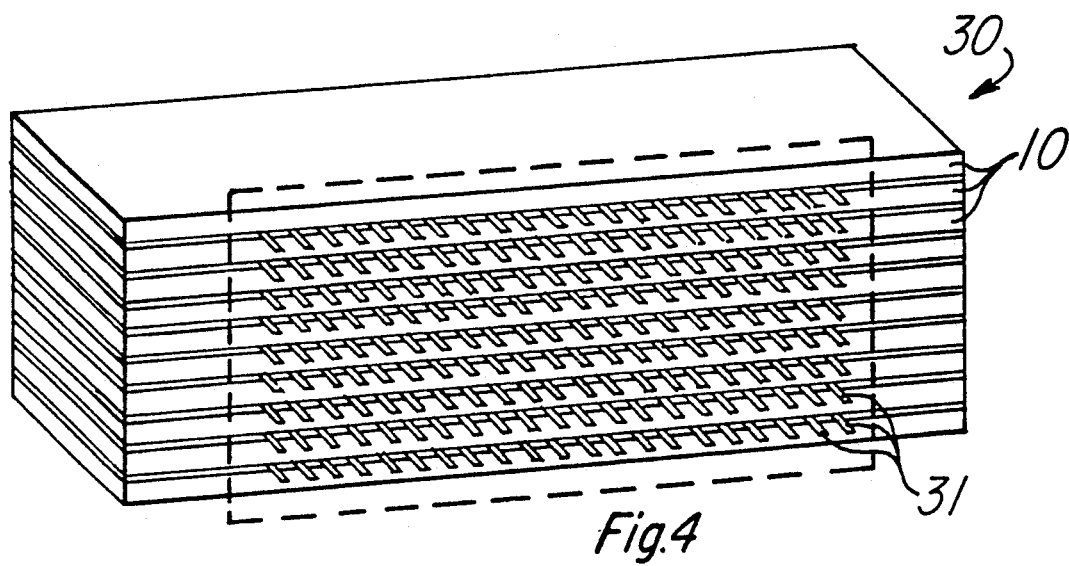
FIG. 4 is a perspective view of a laminated stack of memory chips, with the protruding lead ends aligned to form an array of lead tips on a single lateral face of the laminated stack.
Figure 5A:
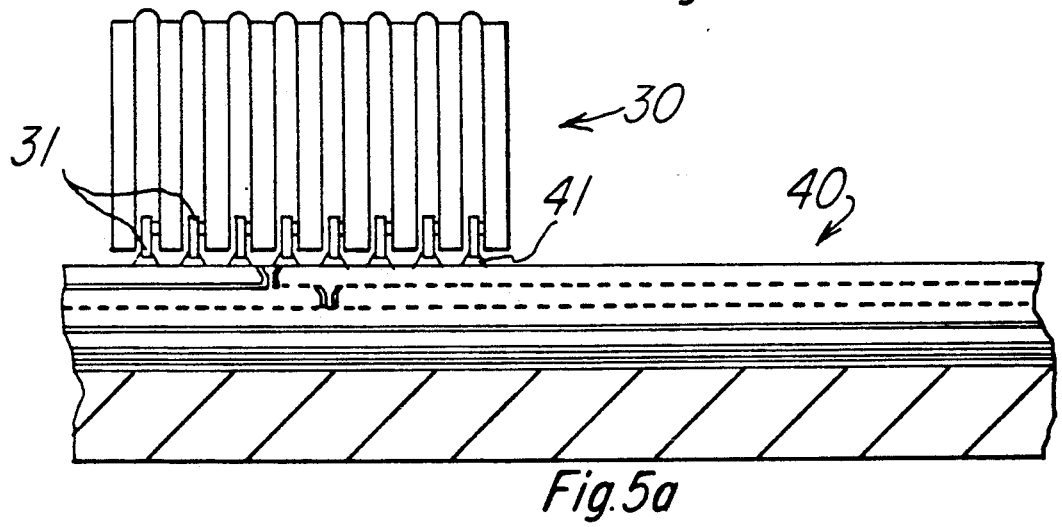
FIG. 5a shows the memory stack of FIG. 4 orthogonally mounted on an interconnect substrate.

As shown in FIG. 4 and FIG. 5a, the laminated stack 30 of the invention consists of plurality of chips 10 then vertically stacked in alignment so that each of the protruding bonded lead tips 31 extends outwardly from a single lateral face of the laminated stack.

As shown in FIG. 5a, the laminated stack of FIG. 4 is orthogonally mounted upon substrate 40 by means of a solder joint 41 formed between the substrate and each of the respective bonded lead tips 31 extending outwardly from the face of the laminated stack.

Figure 5B:
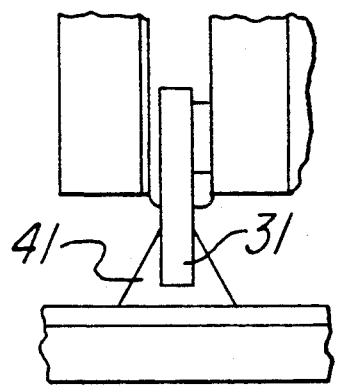
FIG. 5b highlights the solder connections of the lead tips to an array of pads on the substrate.

In FIG. 5b a single electrical connection 41 is highlighted. Each pad of the array of pads on the substrate, to which leads 31 are connected, is preferably configured with an enlarged rectangular pattern in order to allow for any minor misalignment that may occur when the chips are laminated.

Figure 6:
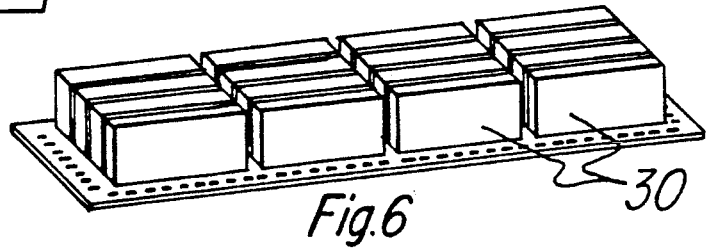
FIG. 6 shows an array of laminated chip stacks orthogonally mounted on a single substrate.

As shown in FIG. 6 a plurality of laminated stacks 30 is orthogonally mounted in an array on the same substrate, such that a multi-chip circuit module is formed, to complete the most readily manufacturable, high density three dimensional packaging for circuit chips.

Figure 7:
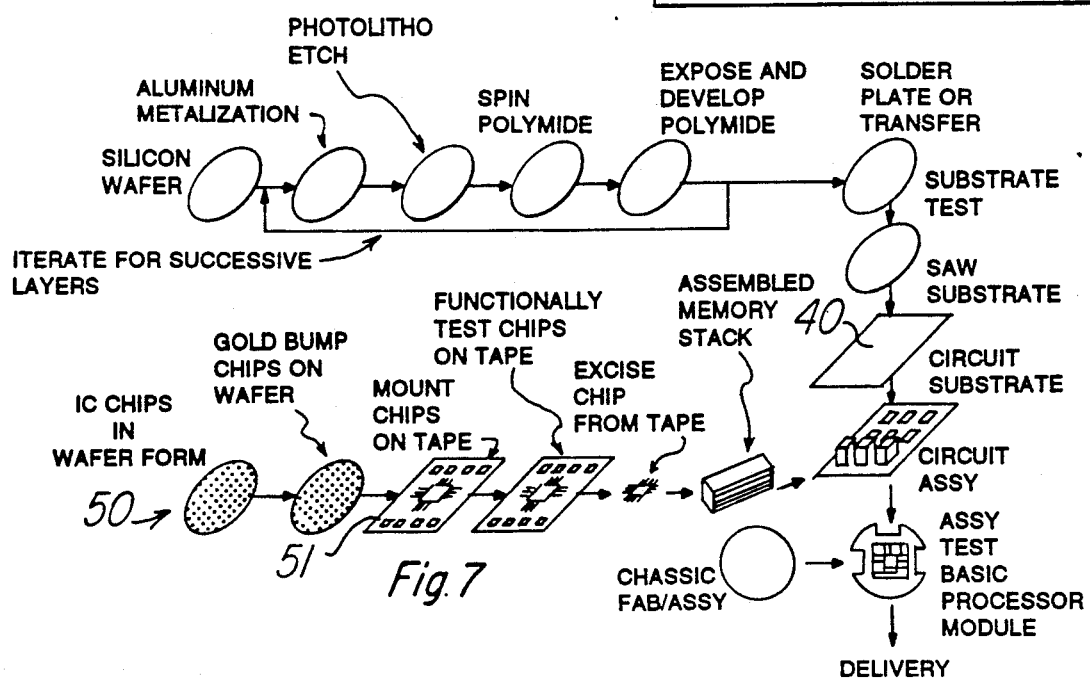
FIG. 7 illustrates the manufacturing process flow used in the fabrication of high density multi-chip modules in accordance with the invention.

The complete process flow used in accordance with the invention is summarized in FIG. 7. Note particularly that the initial sequence of steps for providing each chip 10 with a reroute pattern is carried out before the chips are separated from each other. That is, the final layer dielectric and the final pattern of thin film metal interconnects is applied to each chip while in wafer form 50, in order to take advantage of conventional lithography and thin film etching techniques. This is an essential departure from the prior method of U.S. Pat. No. 5,025,306, which requires the separate fabrication of reroute patterns on dielectric spacers.

Subsequently, the individual chips are separated from the wafer 50 and are mounted on tape 51 by connecting the gold bumps 18 and 21 of each chip to leads 20 and 22 previously patterned on the tape. Next, each of the bonded chips is functionally tested while mounted on the tape. This provides an extra measure of efficiency to eliminate the assembly of defective chips and/or defectively bonded leads. Each chip, with bonded leads attached, is then removed from the tape by simply cutting away from the tape that portion thereof which includes the bonded leads. A plurality of chips is then assembled into laminated stacks as previously shown.

The tape automated bonding (TAB) step for attaching leads 20 and 22 to each chip is fully described in the Proceedings of the International Electronics Packaging symposium (IEPS), of Sep. 27-30, 1992, pages 767-864; and in the 1992 Proceedings of the International TAB Symposium.

In parallel, the fabrication of a circuit substrate 40 is carried out by forming successive layers of thin film metallization separated by polyimide insulating film, using known methods of photolithography and thin film patterning by selective etching. As previously described, a plurality of laminated chip stacks is then orthogonally mounted by electrical connections to the substrate.

Figure 8:
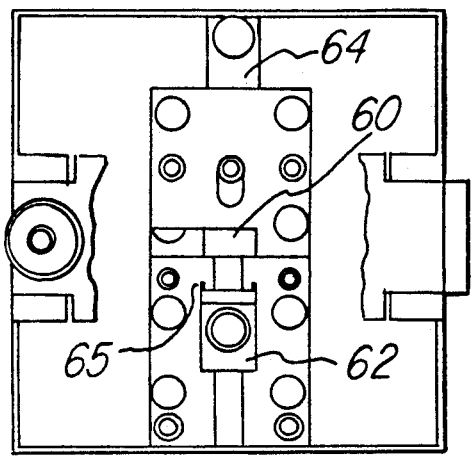
FIG. 8 is a top view of the lamination fixture used in the assembly of the module of the invention, for the purpose of precisely aligning the edges of the chips so that all of the lead tips extending externally of each chip will be the same length when the laminated stack is removed from the fixture.
Figure 9:
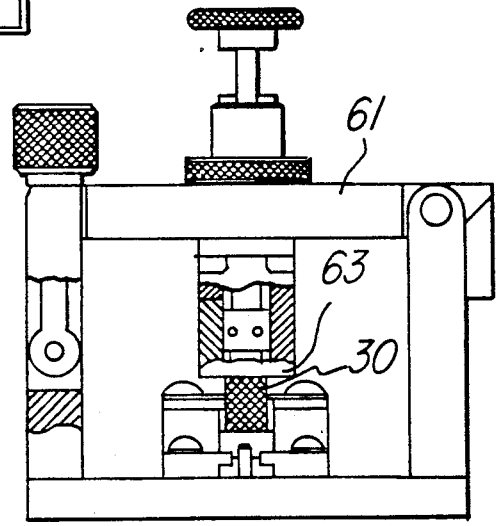
FIG. 9 is a cross-sectional side view of the lamination fixture.

Referring now to FIGS. 8 and 9, the tooling used for laminating the integrated circuit chips is described. The tool includes a highly toleranced cavity 60 in which the chips are stacked after the application of adhesive to a face of each chip. Before curing of the adhesive, the chips are easily readjusted for alignment purposes. A preferred adhesive is known as Ciba-Geigy Epibond 7402 polyimide resin adhesive.

In order to allow for ease of loading and unloading, the fixture includes a hinged upper support 61. When the desired number of chips are loaded into the fixture, a force is then applied to the chips by clamp 62 in a direction parallel with the face of each chip, in order to align the edges of the chips so that each of the bonded lead tips will be exactly aligned. Subsequently, a second force is applied by means of plunger 63, in a direction perpendicular to the face of each chip. While the chip stack 30 is thus held in place, the assembly is heated to a temperature sufficiently elevated to cure the adhesive, in order to complete the lamination step. For example, a temperature of 150° for ½ hour, followed by 275° for one hour is preferred. To facilitate the removal of the cured, three-dimensional stack from the fixture, a precision slide mechanism 64 is provided.

Note that the leading edges 65 of clamp 62 extend outwardly from the clamp face, in order to protect leads 31 from contact with the face of the clamp. Thus, the only clamp contact with the chip stack is by edges 65, outside the boundaries of the array of leads 31.

What is claimed is:

1. A multi-chip circuit module comprising a plurality of circuit chips assembled in a laminated stack, each of said chips having a plurality of layers of thin-film interconnect patterns thereon, a final layer of which comprises a reroute pattern that locates all circuit input and output pads along a single edge of each chip, and further including a bonded lead extending from each rerouted I/O pad to a point beyond said single edge of each chip, whereby an array of protruding lead tips extends from a single lateral face of said laminated stack.

2. The multichip circuit module as in claim 1, further including a second set of relocated input and output pads along the opposite edge of said chip, and further including a first set of bonded leads extending from said second set of pads, whereby testing of electrical connections to the first set of bonded leads is facilitated.

3. The multichip circuit module as in claim 1, wherein said reroute patent comprises a film having two sublayers of titanium-tungsten separated by aluminum.

4. The multichip circuit module as in claim 1, wherein said bonded leads comprises gold-plated copper, attached to tin-plated gold bumps on each pad, respectively.

* * * * *